(12) United States Patent
Aude et al.

(10) Patent No.: US 8,416,112 B2
(45) Date of Patent: Apr. 9, 2013

(54) CIRCUITRY AND METHOD FOR DIGITAL TO ANALOG CURRENT SIGNAL CONVERSION WITH PHASE INTERPOLATION

(75) Inventors: Arlo J. Aude, Atlanta, GA (US); Steven E. Finn, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 81 days.

(21) Appl. No.: 13/187,674

(22) Filed: Jul. 21, 2011

(65) Prior Publication Data

US 2013/0021186 A1  Jan. 24, 2013

(51) Int. Cl.
*H03M 1/80* (2006.01)
(52) U.S. Cl.
USPC .......................................... 341/153; 341/144
(58) Field of Classification Search .................. 341/153, 341/144, 145, 150, 137, 154, 162; 327/108, 327/404, 103, 113, 427, 434, 65, 96
See application file for complete search history.

(56) References Cited

U.S. PATENT DOCUMENTS

| | | |
|---|---|---|
| 6,507,304 B1 | 1/2003 | Lorenz |
| 7,009,547 B2 | 3/2006 | Guo et al. |
| 7,068,201 B1 | 6/2006 | Chou |
| 7,162,002 B2 | 1/2007 | Chen et al. |
| 7,173,554 B2 | 2/2007 | Tucholski |
| 7,312,740 B2 | 12/2007 | Chou |
| 7,626,528 B2 | 12/2009 | Chang et al. |
| 7,629,910 B2 | 12/2009 | Ramadoss et al. |
| 7,710,301 B2 | 5/2010 | Ueno et al. |
| 7,764,211 B2 | 7/2010 | Tokumaru et al. |
| 7,825,843 B2 | 11/2010 | Ikoma |
| 7,990,300 B2* | 8/2011 | Takiguchi ..................... 341/144 |

* cited by examiner

*Primary Examiner* — Joseph Lauture
(74) *Attorney, Agent, or Firm* — Andrew S. Viger; Wade J. Brady, III; Frederick J. Telecky, Jr.

(57) ABSTRACT

Circuitry and method for digital-to-analog current signal conversion with phase interpolation. For an n-bit digital-to-analog converter (DAC), the number $2^n$ control bits normally required can be reduced to $2^{(n-1)}$ by jointly controlling pairs of the current sources with one of the $2^{(n-1)}$ current control bits and inverses of two other ones of the $2^{(n-1)}$ current control bits.

20 Claims, 8 Drawing Sheets

CIRCUITRY AND METHOD FOR DIGITAL TO ANALOG CURRENT SIGNAL CONVERSION WITH PHASE INTERPOLATION

BACKGROUND

1. Field of the Invention

The present invention relates to digital-to-analog converters (DACs), and in particular, to DACs used for phase interpolation.

2. Related Art

Conventional phase interpolation DACs have their precision and physical size determined by the number $2^n$ of steps that are available. In a unary-weighted current steering DAC circuit architecture, the large number $2^n$ of control signals, or bits, needed to control each of the current sources can be problematic in terms of the amount of physical area required to route so many signals. Further, another large layout area is required to perform the necessary decoding operations for the n-bit digital signal to create the $2^n$ control signals necessary for the DAC.

Accordingly, it would be desirable to have a technique for reducing the number of DAC control signals while maintaining the same precision or resolution.

BRIEF DESCRIPTION OF TI-IE DRAWINGS

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry. Thus, for example, one or more of the functional blocks (e.g., processors, memories, etc.) may be implemented in a single piece of hardware (e.g., a general purpose signal processor, random access memory, hard disk drive, etc.). Similarly, any programs described may be standalone programs, may be incorporated as subroutines in an operating system, may be functions in an installed software package, etc.

Figure 1:
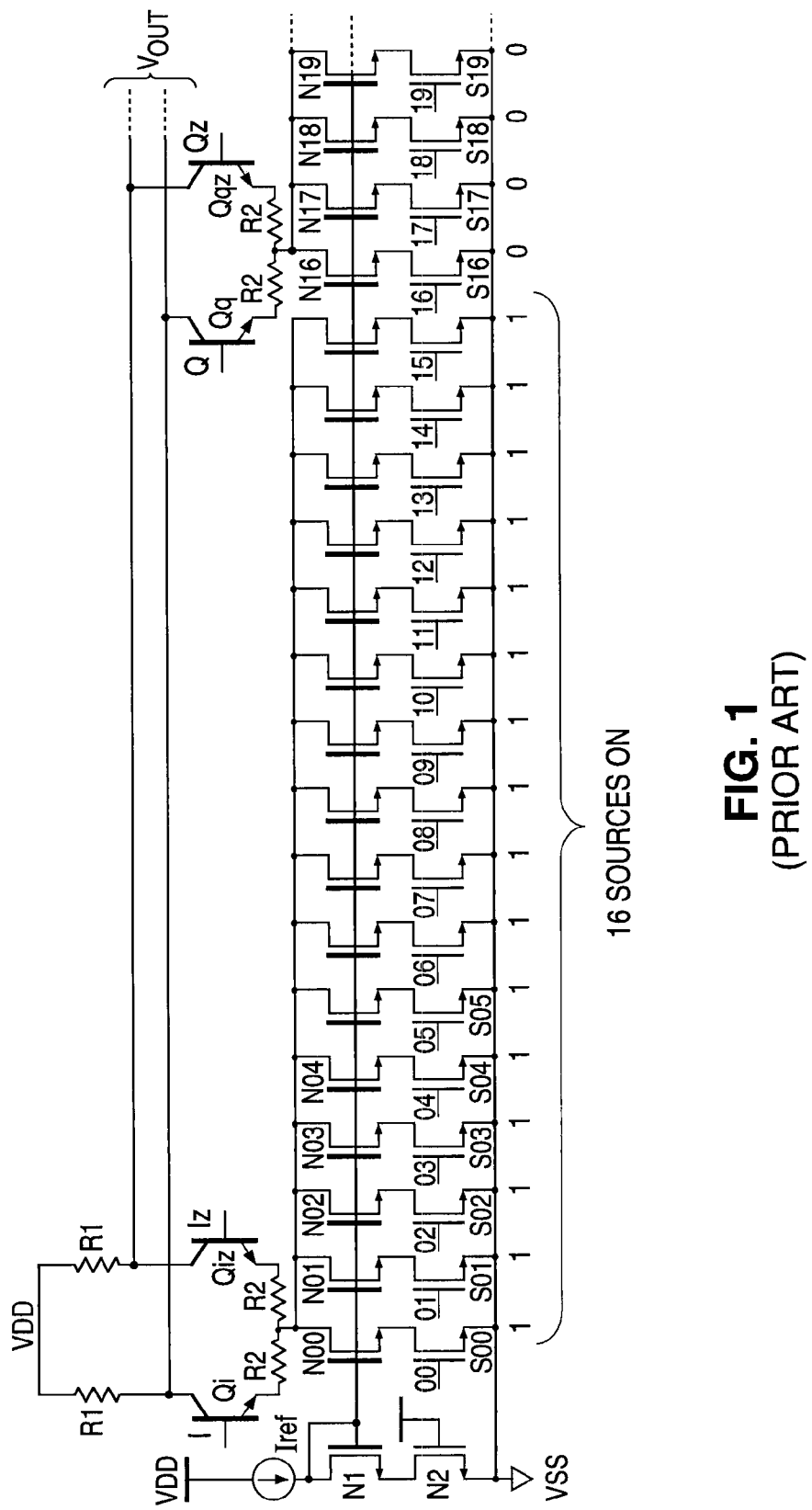
FIG. 1 is a partial schematic diagram of a conventional phase interpolating DAC.

Referring to FIG. 1, a conventional phase interpolating DAC includes current steering circuitry in the form of differential amplifiers, which are often implemented using bipolar junction transistors Qi, Qiz, Qq, Qqz and resistances R1, R2, interconnected substantially as shown. A current source Iref provides current to the input branch of a current mirror circuit formed by totem-pole-coupled N-type MOSFETs N1, N2, with the first transistor N1 being diode-coupled and the second transistor N2 having its gate electrode biased to be in a constant on state. In accordance with well-known principles, this input current Iref is replicated, or mirrored, as the channel current of each of the tail current sources formed by transistors N00, N01, N02, . . . , N63 (for a 64-bit DAC). Conduction of the channel current through each of these transistors N00, N01, N02, . . . , N63 is enabled and disabled by switches S00, S01, S02, . . . , S64, typically implemented as additional N-MOSFETs, each of which is turned on and off, i.e., enabled and disabled, respectively, by a corresponding one of the current control bits 00, 01, 02, . . . , 64. (The current mirror transistors N00, N01, N02, N63 are often implemented as thick gate devices for 2.5 volt operation, while the switching transistors S00, S01, S02, . . . , S63 are often implemented as thin gate devices for operation at 1.2 volts.) Accordingly, as depicted in FIG. 1, when the first 16 current sources are turned on, the first 16 current control bits 00, 01, 02, are asserted, i.e., at a high signal state, thereby allowing current flow through their corresponding current mirror output transistors N00, N01, N02, . . . , N15.

Figure 2:
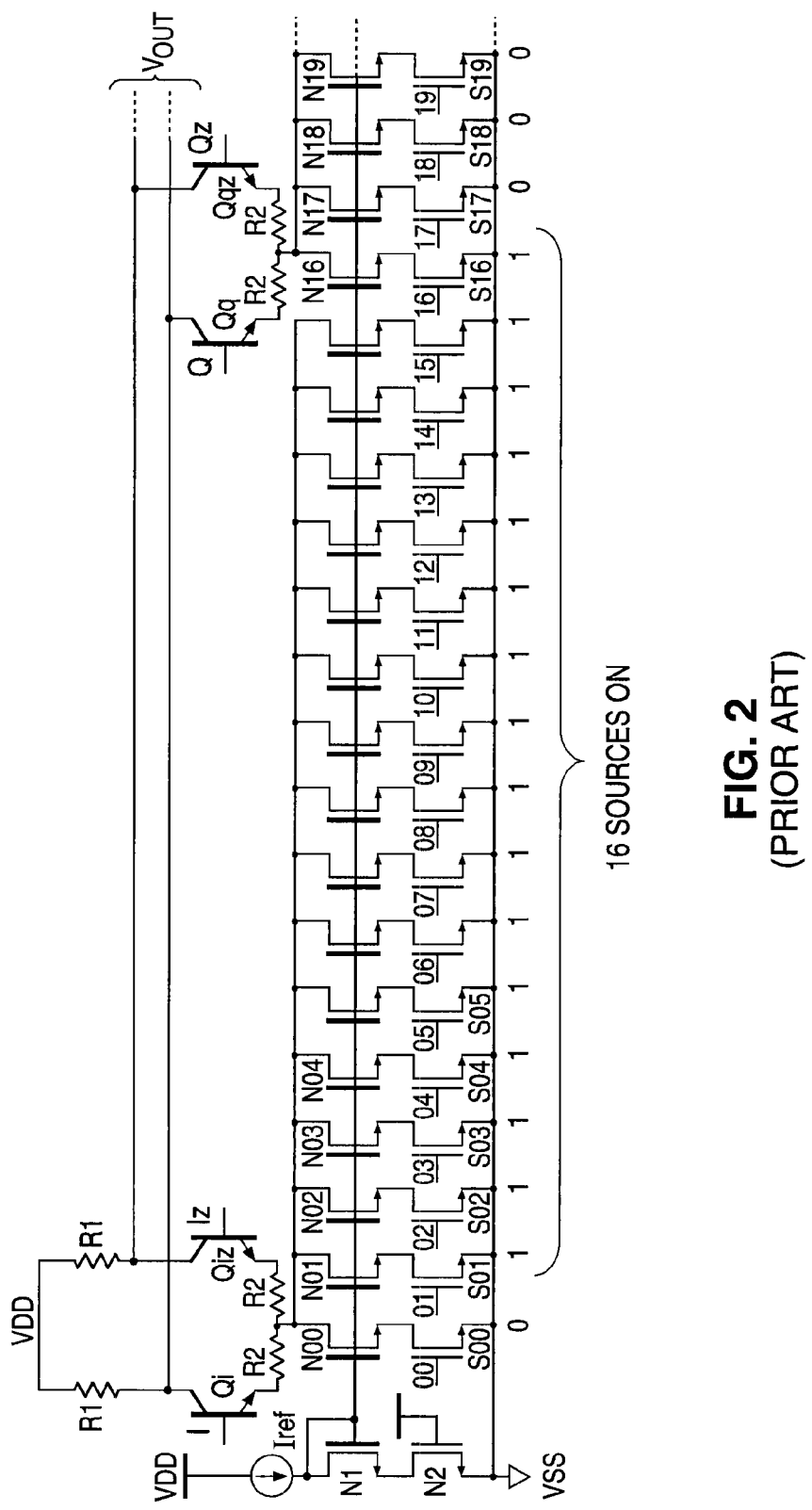
FIG. 2 depicts the circuitry of FIG. 1 with devices turned on and off to present the output signal with a different phase.

Referring to FIG. 2, providing current at the next phase is achieved by de-asserting the first control bit 00 to turn off the first switch S00, while asserting control bit 16 to turn on the next downstream switch S16, thereby enabling current flow through its current mirror transistor N16. As can be seen, the full complement of $2^n$ control bits are necessary, thereby requiring a large area for routing the signals and a corresponding large area for the decode logic to provide the signals.

As is well known in the art, this circuitry is operated in this manner so that a given amount of current is being steered out of the DAC at all times, thereby requiring a number m of adjacent current sources to be turned on at all times. Accordingly, to adapt forward to the next step in phase, one leading control bit is asserted to turn on the corresponding leading current source, while simultaneously de-asserting a lagging control bit to turn off the corresponding lagging current source. This ensures that only m bits are enabled.

As discussed in more detail below, a DAC in accordance with the presently claimed invention effectively partitions decoding between the CMOS digital logic (not shown) and the unary current source bank. The decode logic (discussed in more detail below) generates an intermediate set of control bits, adapting to the next step by turning on a leading control bit without turning off the lagging control bit. The subsequent adaptation then turns off the lagging bit. Accordingly, at any point in time either m/2 or m/2+1 bits out of $2^n$ bits are enabled. Each of these $2^n$ control bits and their inversions are used to control the current DAC. Hence, while there are effectively still $2^n$ control signals used, half of them are space- and logic-efficient inversions of the original decoded control bits.

The current steering DAC is implemented using $2^n$ unary current sources (e.g., output branches of a current mirror circuit) and efficiently decodes m/2 or m/2+1 bits to determine which of the m unary current sources should be enabled. The look-ahead and look-behind circuit structure uses the adjacent nature of the "on" control bits to decode which unary current sources should be enabled. Thus, for a current steering DAC in accordance with the presently claimed invention, n is an integer three or greater, so $2^n$ is greater than or equal to eight, and m is an even integer $2^n-2$ (corresponding to such look-ahead and look-behind circuit structure).

Conduction of current through each of the current sources is enabled and disabled with two serially coupled switches that provide switching on two levels. On one level, each of the two $2^{n-1}$ non-inverted control bits 00, 01, 02, . . . , 31 is used to turn on two adjacent switches, i.e., for a total of $2^n$ switches. On another level, inverted versions of the control bits 00z, 01z, 02z, . . . , 31z (where "z" indicates an inverted control bit) from ahead and behind the current DAC phase step are used to turn on and off the other two switches in the pair of DAC current paths.

Accordingly, at any two current sources controlled by a control bit k on the first level of switches, one of the second-level switches will have the inversion of control bit k+m/2 while the other second-level switch will have the inversion of control bit k−m/2. By way of example, in a 64 weight current DAC (where n=6, $2^n$=64 and m=16), 16 current sources always need to be enabled at a given time. Accordingly, if control bit 08 is controlling current sources 16 and 17, the second level control bits will be 16z and 00z. This look-ahead, look-behind circuit structure effectively decodes the m/2 or m/2+1 bits to give $2^n$ precision from a $2^{n-1}$ decoder logic arrangement.

Figure 3:
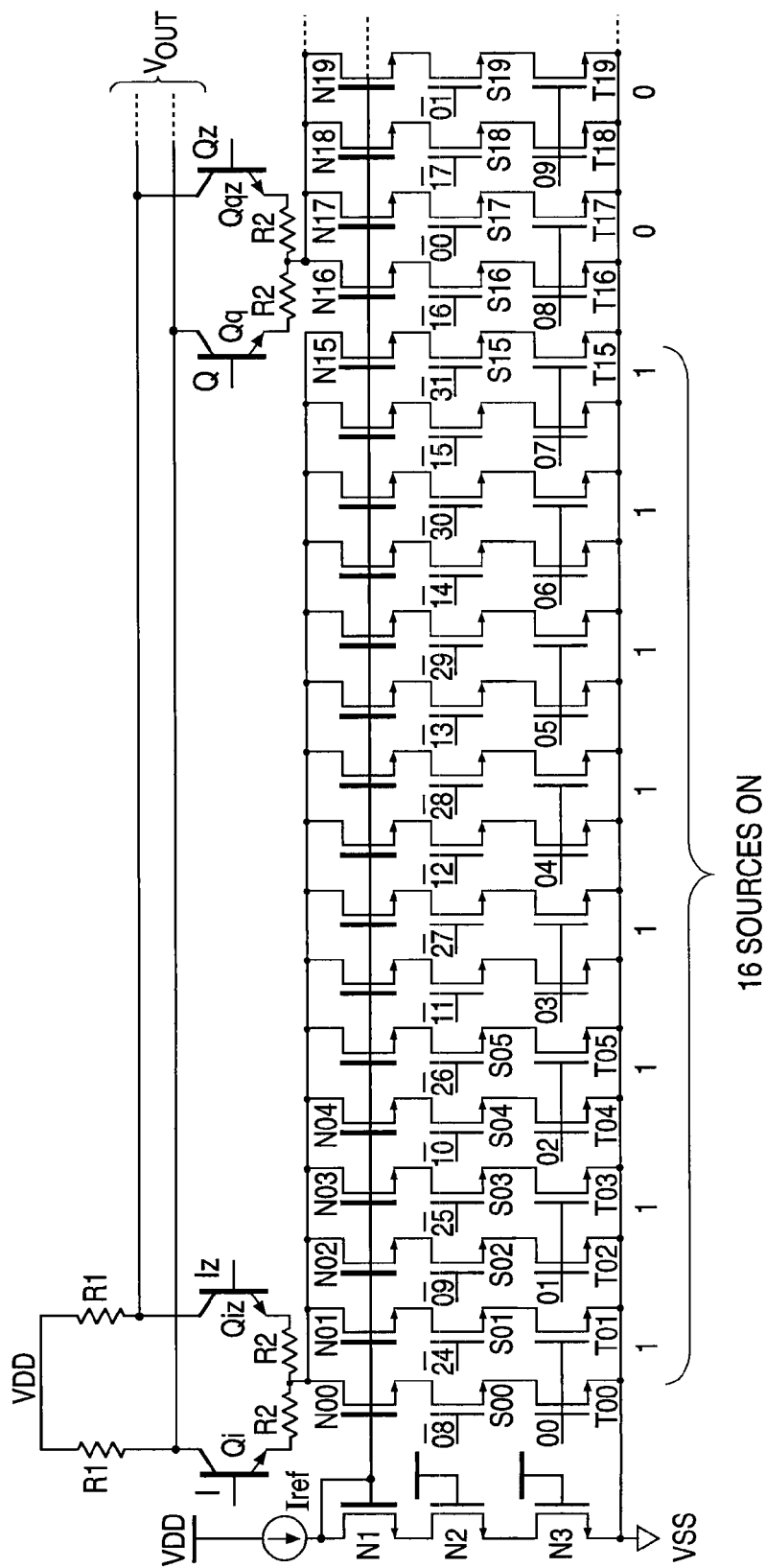
FIG. 3 is a partial schematic diagram of a phase interpolating DAC in accordance with one embodiment of the presently claimed invention.

Referring to FIG. 3, in accordance with one embodiment of the presently claimed invention, as discussed above, the first 16 current sources are turned on due to the enablement of their two levels of switches. In other words, with the first 16 current sources enabled, control bits 00, 01, 02, . . . , 07 are asserted high, thereby turning on first-level switches T00, T01, T02, . . . and T15. Additionally, inverted forms of look-ahead and look-behind control bits are asserted, thereby turning on second-level switches S00, S01, S02, . . . and S15.

Figure 4:
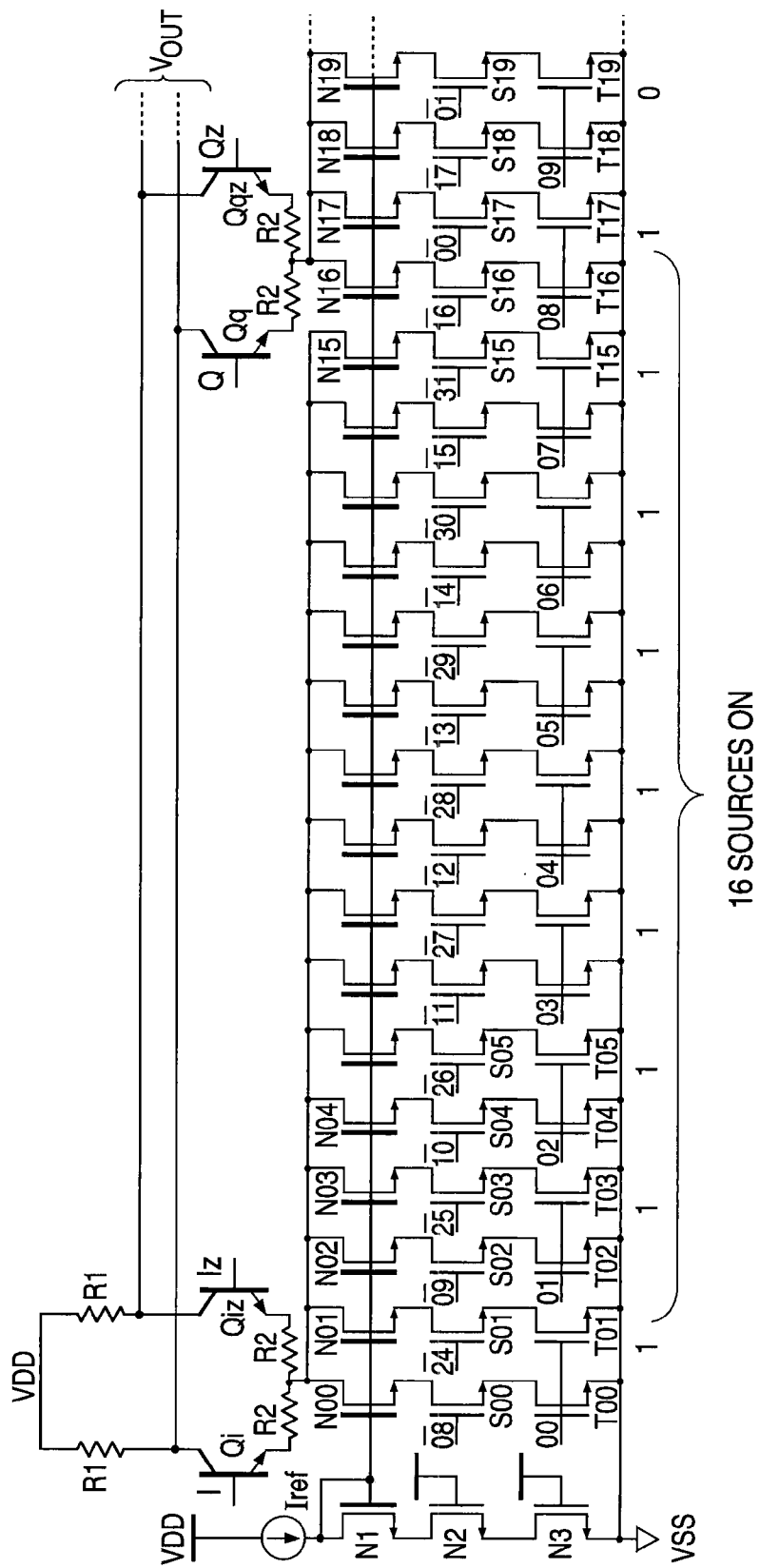
FIGS. 4, 5, 6 and 7 depict the circuitry of FIG. 3 with different current sources enabled and disabled to provide currents with different phases.

Referring to FIG. 4, to enable the next current phase, while still keeping only 16 current sources turned on, the first-level switches T16 and T17 are turned on, second-level switch S00 is turned off and second-level switch S16 is turned on, while adjacent second-level switch S17 remains off. Accordingly, current flow through leading current source transistor N16 is enabled, while current flow through lagging current source transistor N00 is disabled.

Figure 5:
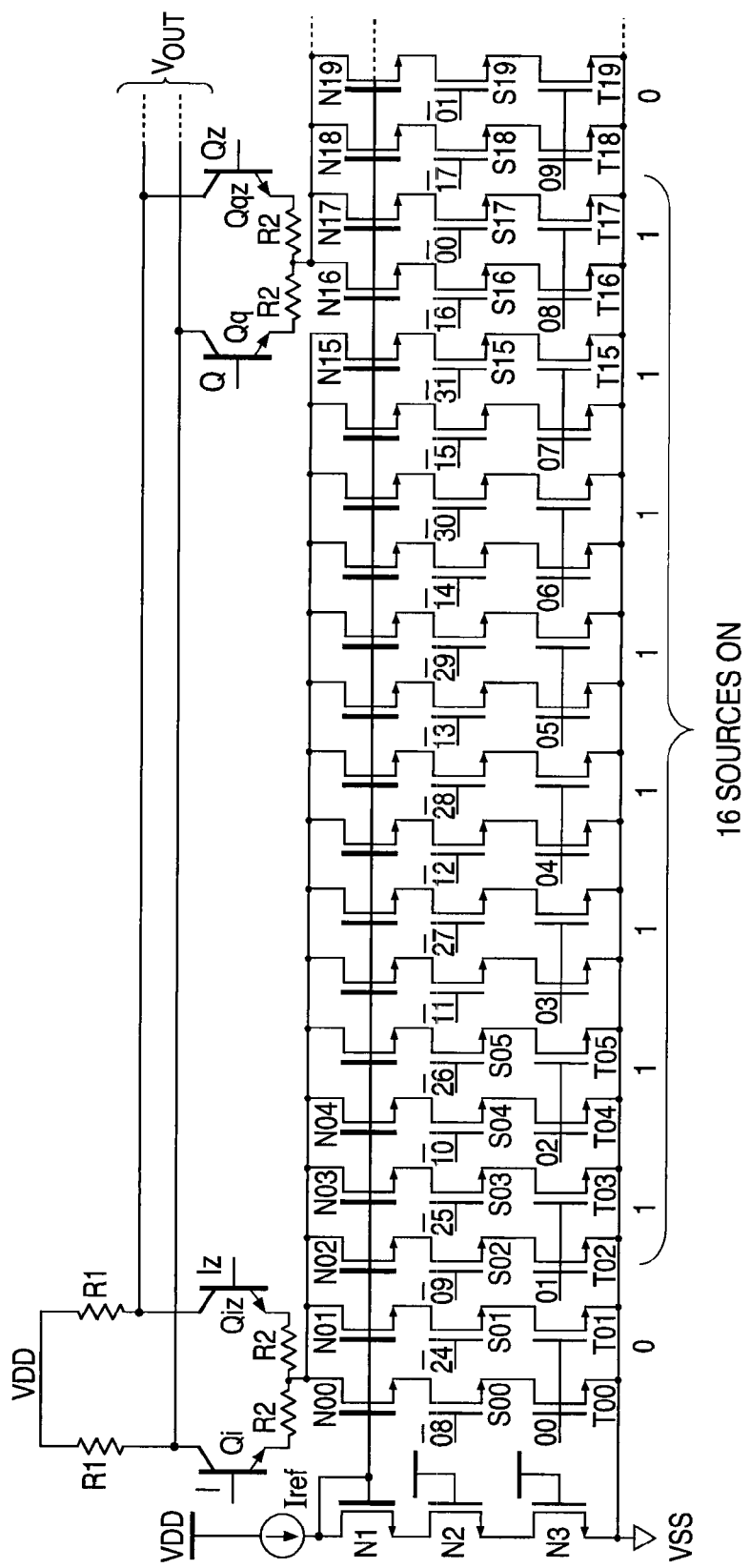

Referring to FIG. 5, the next current phase is provided by completing enablement of the leading current source transistor pair N16 and N17 and disabling the lagging current source transistor pair N00 and N01 by turning on leading second-level switch S17 and turning off lagging first-level switches T00 and T01.

Figure 6:
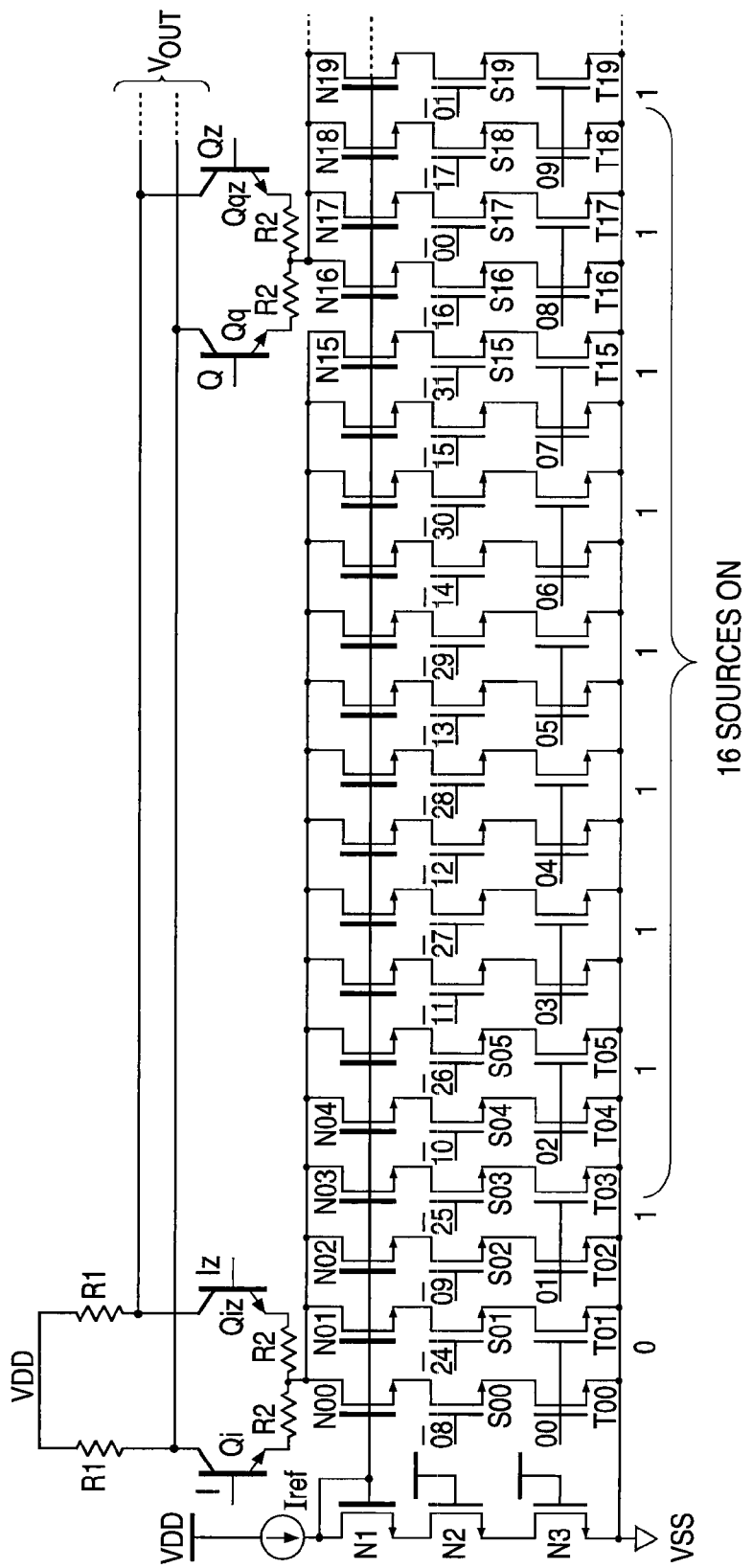

Referring to FIG. 6, the next current phase is provided by partially enabling the next leading current source transistor pair and partially disabling the lagging current source transistor pair. In other words, first-level switches T18 and T19 are turned on by control bit 09, second-level switch S18 is turned on by inverted control bit 17z and second-level switch S02 is turned off by inverted control bit 09z, while second-level switch S19 remains off and first-level switches T02 and T03 remain on.

Figure 7:
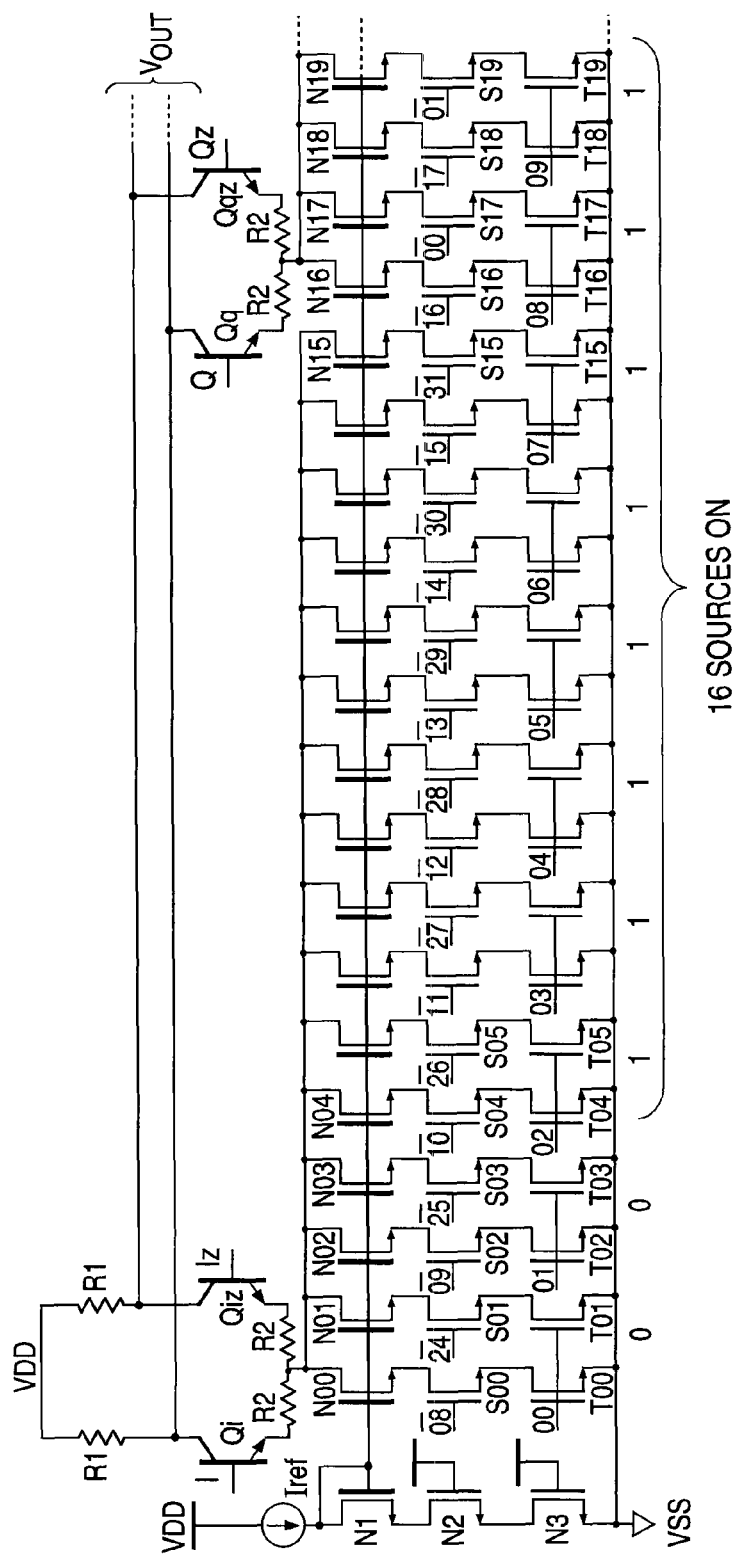

Referring to FIG. 7, the next current phase is provided by completing enablement of the leading current source transistor pair N18 and N19 and completing disablement of the lagging current source transistor pair N02 and N03. This is done by turning on leading second-level switch S19 and turning off lagging first-level switches T02 and T03.

Figure 8:
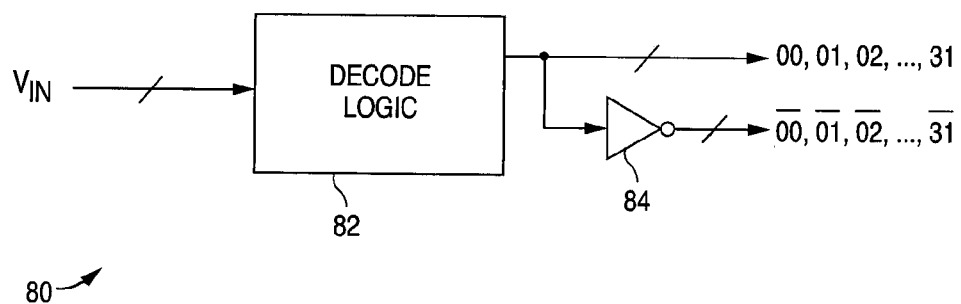
FIG. 8 is a functional blank diagram depicting the decoding of the original digital input signal to provide the current control bits.

Referring to FIG. 8, as discussed above, the CMOS digital logic is simplified by only requiring decode logic 82 to provide $2^{n-1}$ control bits 00, 01, 02, . . . , (n−1), plus inversion circuitry 84 to provide their inverted versions 00z, 01z, 02z, . . . , (n−1)z.

Figure 9:
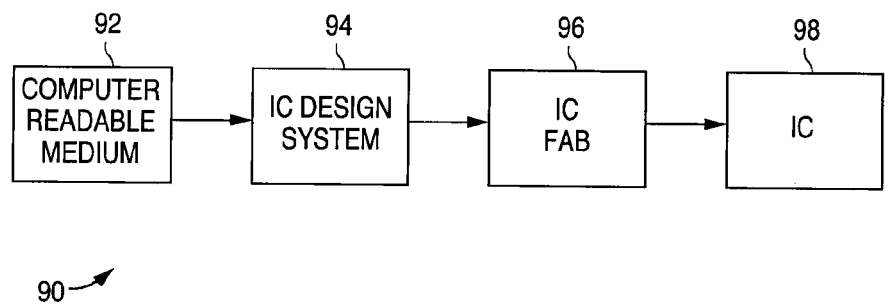
FIG. 9 is a functional block diagram of an exemplary embodiment of an integrated circuit design and fabrication system operated in accordance with computer instructions.

Referring to FIG. 9, integrated circuit (IC) design systems 94 (e.g., work stations or other forms of computers with digital processors) are known that create integrated circuits based on executable instructions stored on a computer readable medium 92, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instructions (e.g., computer code) that, when executed by the IC design system 94, cause an IC fabrication system 96 to produce an IC 98 that includes the devices or circuitry as set forth herein. Accordingly, the devices or circuits described herein may be produced as ICs 98 by such IC design systems 94 executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current steering digital-to-analog converter (DAC), comprising:
   current steering circuitry responsive to a plurality of currents by providing one or more analog voltages related to said plurality of currents; and
   current source circuitry including $2^n$ current source circuits, where n is an integer three or greater, coupled to said current steering circuitry and responsive to $2^n$ current control bits k by providing said plurality of currents, wherein
   each current control bit k of said plurality of $2^{(n-1)}$ current control bits, where $0 \leq k \leq 2^{(n-1)}-1$, corresponds to one of a sequence $0, 1, 2, \ldots, 2^{(n-1)}-1$,
   said plurality of currents includes a m currents provided by m of said $2^n$ current source circuits, where m is an even integer $2^n-2$, said $2^n$ current source circuits includes $2^{(n-1)}$ pairs of current source circuits, each of which corresponds to one of said sequence $0, 1, 2, \ldots, 2^{(n-1)}-1$, and each one of said $2^{(n-1)}$ successive pairs of current source circuits is jointly enabled and disabled by a respective one of said $2^{(n-1)}$ current control bits k and inverses of first and second other ones of said $2^{(n-1)}$ current control bits k.

2. The apparatus of claim 1, wherein said current steering circuitry comprises differential amplifier circuitry.

3. The apparatus of claim 2, wherein said current source circuitry comprises $2^n$ tail current source circuits.

4. The apparatus of claim 2, wherein said current source circuitry comprises current mirror circuitry and said $2^n$ current source circuits comprises $2^n$ output branches of said current mirror circuitry.

5. The apparatus of claim 1, wherein said current source circuitry comprises current mirror circuitry and said $2^n$ current source circuits comprises $2^n$ output branches of said current mirror circuitry.

6. The apparatus of claim 1, wherein each one of said plurality of $2^n$ current source circuits comprises:
at least one transistor responsive to a bias voltage by conducting a current;
a first current switching device serially coupled with said at least one transistor and responsive to said respective one of said $2^{(n-1)}$ current control bits k by allowing and disallowing conduction of said current; and
a second current switching device serially coupled with said first current switching device and said at least one transistor, and responsive to one of said inverses of first and second other ones of said $2^{(n-1)}$ current control bits k by allowing and disallowing conduction of said current.

7. The apparatus of claim 1, wherein said first and second other ones of said $2^{(n-1)}$ current control bits k comprise current control bit k+(m/2) and current control bit k−(m/2).

8. The apparatus of claim 1, wherein each current source circuit of each one of said $2^{(n-1)}$ successive pairs of current source circuits is jointly enabled and disabled by said respective one of said $2^{(n-1)}$ current control bits k and a respective one of said inverses of first and second other ones of said $2^{(n-1)}$ current control bits k.

9. The apparatus of claim 8, wherein said first and second other ones of said $2^{(n-1)}$ current control bits k comprise current control bit k+(m/2) and current control bit k−(m/2).

10. An apparatus, comprising:
decode circuitry configured to decode a control input into $2^{(n-1)}$ current control bits, and inverses of said $2^{(n-1)}$ current control bits, where n is an integer three or greater; and
a current steering digital-to-analog converter (DAC) including
current steering circuitry responsive to a plurality of currents by providing one or more analog voltages related to said plurality of currents; and
current source circuitry including $2^n$ current source circuits coupled to said current steering circuitry and responsive to said $2^{(n-1)}$ current control bits k by providing said plurality of currents, wherein
each current control bit k of said $2^{(n-1)}$ current control bits, where $0 \leq k \leq 2^{(n-1)}-1$, corresponds to one of a sequence $0, 1, 2, \ldots, 2^{(n-1)}-1$,
said plurality of currents includes m currents provided by m of said $2^n$ current source circuits, where m is an even integer $2^n-2$,
said $2^n$ current source circuits includes $2^{(n-1)}$ pairs of current source circuits, each of which corresponds to one of said sequence $0, 1, 2, \ldots, 2^{(n-1)}-1$, and
each one of said $2^{(n-1)}$ successive pairs of current source circuits is jointly enabled and disabled by a respective one of said $2^{(n-1)}$ current control bits k and inverses of first and second other ones of said $2^{(n-1)}$ current control bits k.

11. The apparatus of claim 10, wherein said current steering circuitry comprises differential amplifier circuitry.

12. The apparatus of claim 10, wherein each one of said $2^n$ current source circuits comprises:
at least one transistor responsive to a bias voltage by conducting a current;
a first current switching device serially coupled with said at least one transistor and responsive to said respective one of said $2^{(n-1)}$ current control bits k by allowing and disallowing conduction of said current; and
a second current switching device serially coupled with said first current switching device and said at least one transistor, and responsive to one of said inverses of first and second other ones of said $2^{(n-1)}$ current control bits k by allowing and disallowing conduction of said current.

13. The apparatus of claim 10, wherein said first and second other ones of said $2^{(n-1)}$ current control bits k comprise current control bit k+(m/2) and current control bit k−(m/2).

14. The apparatus of claim 10, wherein each current source circuit of each one of said $2^{(n-1)}$ successive pairs of current source circuits is jointly enabled and disabled by said respective one of said $2^{(n-1)}$ current control bits k and a respective one of said inverses of first and second other ones of said $2^{(n-1)}$ current control bits k.

15. The apparatus of claim 14, wherein said first and second other ones of said $2^{(n-1)}$ current control bits k comprise current control bit k+(m/2) and current control bit k−(m/2).

16. A method of digital-to-analog current steering signal conversion, comprising:
steering current in response to a plurality of currents respectively provided by $2^n$ current sources to generate one or more analog voltages related to said plurality of currents, where n is an integer three or greater; and
responding to $2^{(n-1)}$ current control bits k by providing said plurality of currents, wherein
each current control bit k of said $2^{(n-1)}$ current control bits, where $0 \leq k \leq 2^{(n-1)}-1$, corresponds to one of a sequence $0, 1, 2, \ldots, 2^{(n-1)}-1$,
said plurality of currents includes m currents provided by m of said $2^n$ current sources, where m is an even integer $2^n-2$,
said $2^n$ current sources includes $2^{(n-1)}$ pairs of current sources, each of which corresponds to one of said sequence $0, 1, 2, \ldots, 2^{(n-1)}-1$, and
each one of said $2^n$ successive pairs of current sources is jointly enabled and disabled by a respective one of said $2^{(n-1)}$ current control bits k and inverses of first and second other ones of said $2^{(n-1)}$ current control bits k.

17. The method of claim 16 wherein said first and second other ones of said $2^{(n-1)}$ current control bits k comprise current control bit k+(m/2) and current control bit k−(m/2).

18. The method of claim 16, wherein each current source of each one of said $2^{(n-1)}$ successive pairs of current sources is jointly enabled and disabled by said respective one of said $2^n$ current control bits k and a respective one of said inverses of first and second other ones of said $2^{(n-1)}$ current control bits k.

19. The method of claim 18, wherein said first and second other ones of said $2^{(n-1)}$ current control bits k comprise current control bit k+(m/2) and current control bit k−(m/2).

20. The method of claim 16, wherein each one of said $2^n$ current sources comprises:
- at least one transistor responsive to a bias voltage by conducting a current;
- a first current switching device serially coupled with said at least one transistor and responsive to said respective one of said $2^{(n-1)}$ current control bits k by allowing and disallowing conduction of said current; and
- a second current switching device serially coupled with said first current switching device and said at least one transistor, and responsive to one of said inverses of first and second other ones of said $2^{(n-1)}$ current control bits k by allowing and disallowing conduction of said current.

\* \* \* \* \*